(12) United States Patent
Nirschl et al.

(10) Patent No.: US 9,025,391 B2
(45) Date of Patent: May 5, 2015

(54) CIRCUIT ARRANGEMENT AND METHOD FOR OPERATING A CIRCUIT ARRANGEMENT

(71) Applicant: Infineon Technologies AG, Neubiberg (DE)

(72) Inventors: Thomas Nirschl, Putzbrunn (DE); Christoph Roll, Kissing (DE); Philipp Hofter, Munich (DE)

(73) Assignee: Infineon Technologies AG, Neubiberg (DE)

(*) Notice: Subject to any disclaimer, the term of this patent is extended or adjusted under 35 U.S.C. 154(b) by 227 days.

(21) Appl. No.: 13/685,737

(22) Filed: Nov. 27, 2012

(65) Prior Publication Data

US 2014/0146618 A1    May 29, 2014

(51) Int. Cl.
| G11C 7/10 | (2006.01) |
| G11C 5/14 | (2006.01) |
| G11C 7/02 | (2006.01) |
| G11C 16/12 | (2006.01) |
| G11C 16/04 | (2006.01) |

(52) U.S. Cl.
CPC .. *G11C 5/14* (2013.01); *G11C 7/02* (2013.01); *G11C 16/12* (2013.01); *G11C 16/0483* (2013.01)

(58) Field of Classification Search
USPC ............. 365/189.02, 189.09, 230.02, 230.03, 365/230.06
See application file for complete search history.

(56) References Cited

U.S. PATENT DOCUMENTS

| 7,177,183 | B2* | 2/2007 | Scheuerlein et al. | 365/185.02 |
| 7,633,829 | B2* | 12/2009 | Fasoli et al. | 365/230.06 |
| 7,706,194 | B2* | 4/2010 | Mori | 365/189.09 |
| 7,936,634 | B2* | 5/2011 | Chen et al. | 365/230.02 |
| 8,149,607 | B2* | 4/2012 | Scheuerlein et al. | 365/100 |
| 8,270,245 | B2* | 9/2012 | Chen et al. | 365/230.02 |

* cited by examiner

*Primary Examiner* — Pho M Luu

(57) ABSTRACT

A circuit arrangement, having a plurality of electronic components; a plurality of first access lines and second access lines, wherein each electronic component is coupled with at least one first access line and at least one second access line; an access controller configured to control an access to at least one electronic component of the plurality of electronic components via the at least one first access line and the at least one second access line; a bias circuit configured to provide a defined potential to at least one of the first access lines, wherein the bias circuit is configured, during an access to an electronic component via one selected first access line of the plurality of first access lines, to provide the defined potential to one or two first access lines of the plurality of first access lines, wherein the one or two first access lines are arranged adjacent to the selected first access line, and, wherein during the access to the electronic component, the potentials of the first access lines of the plurality of first access lines other than the selected first access line and the one or two first access lines arranged adjacent to the selected first access line are floating.

25 Claims, 3 Drawing Sheets

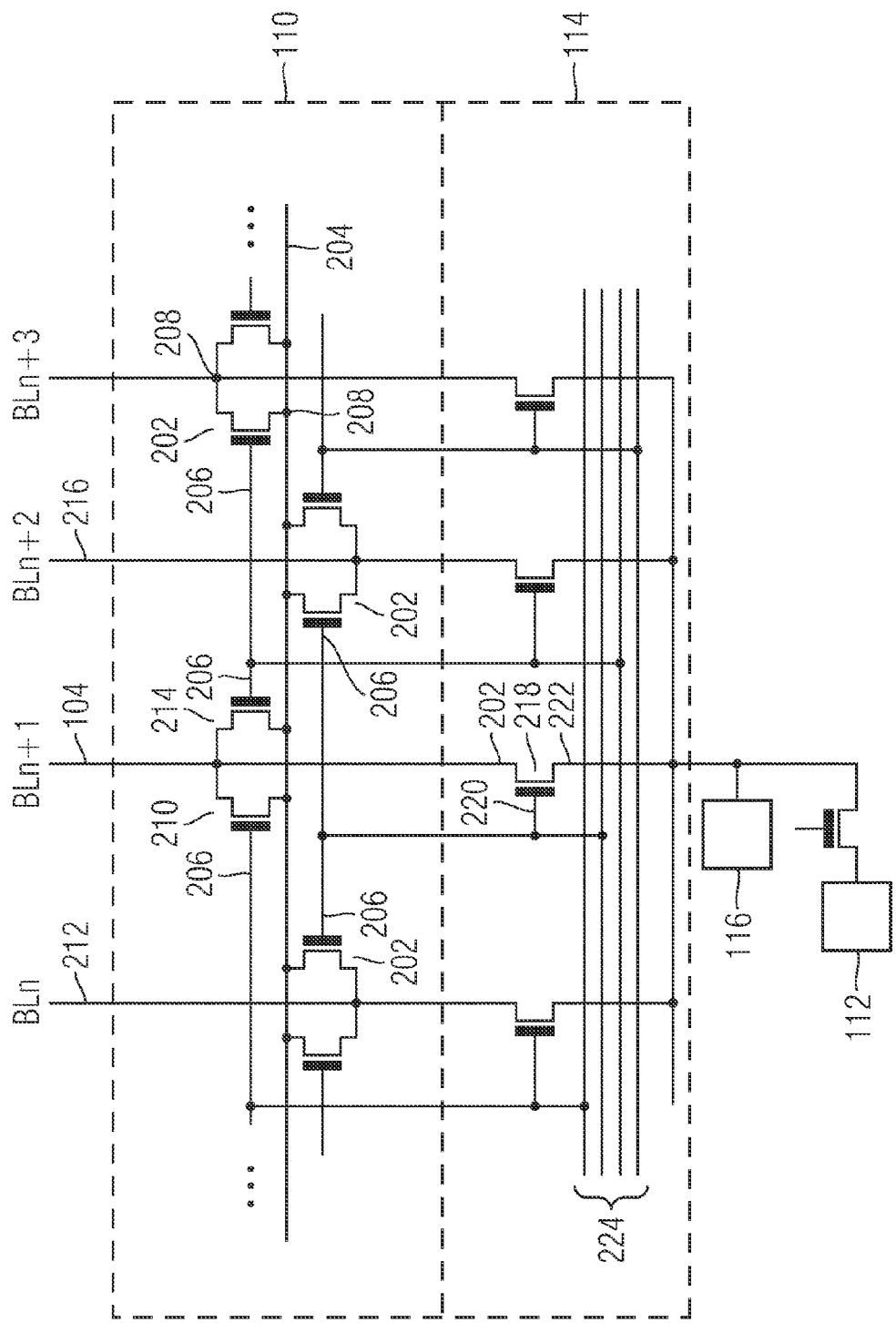

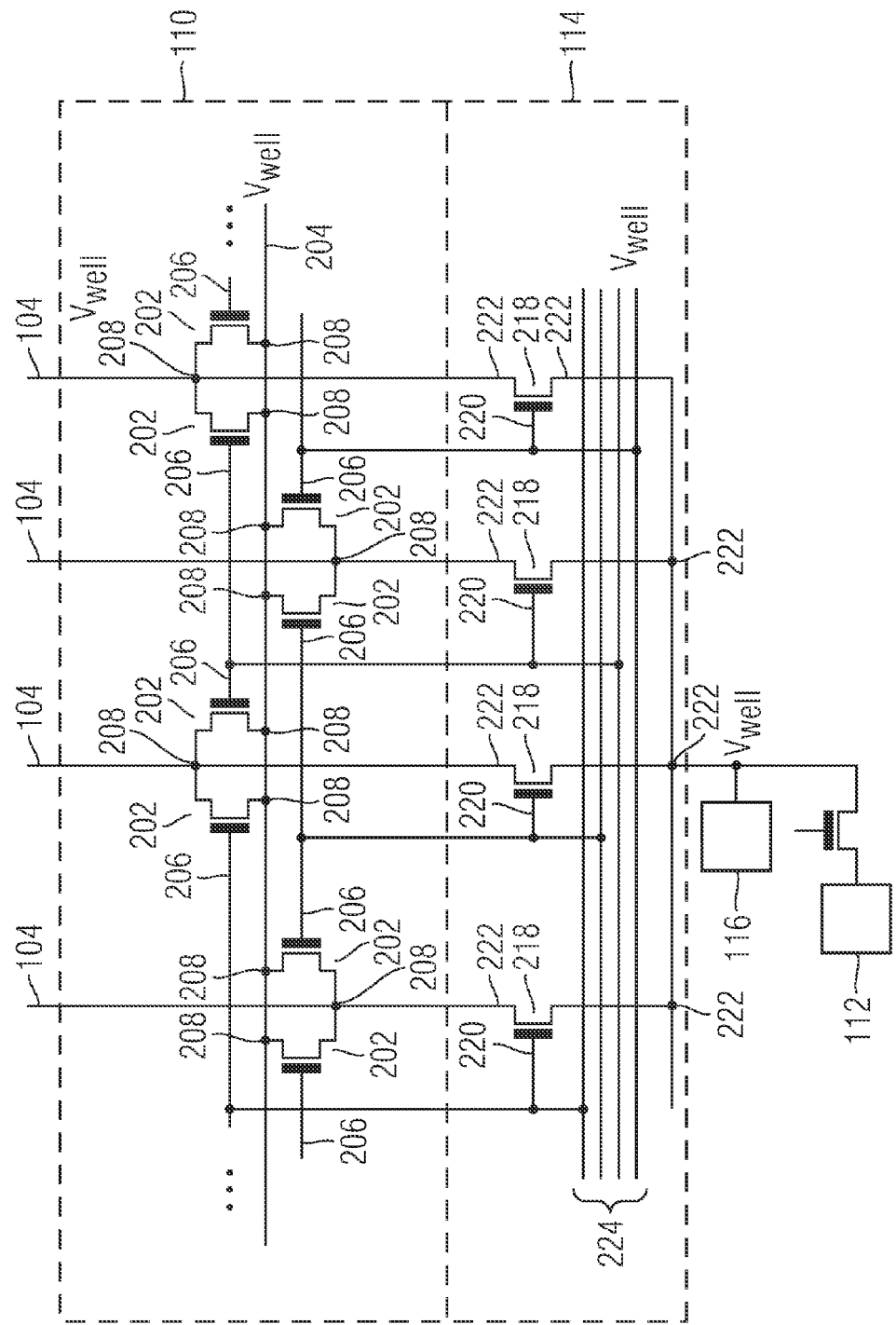

CIRCUIT ARRANGEMENT AND METHOD FOR OPERATING A CIRCUIT ARRANGEMENT

TECHNICAL FIELD

Various embodiments relate generally to a circuit arrangement and a method for operating such a circuit arrangement.

BACKGROUND

Flash memories typically require a high voltage for modifying data. High-voltage devices that can withstand the high voltages are used in such memories. For example, a multiplexer circuit used for selecting a memory cell to be connected to a sense amplifier or to a write buffer circuit requires high-voltage devices. If the sense amplifier is designed for lower voltages, it may need a protection device. The high-voltage is generally generated by a charge pump and leakage current of the multiplexer circuit needs to be minimized.

High-voltage devices generally have thicker gate oxides and larger channel widths and channel lengths than low-voltage devices so that they can withstand the higher electric fields caused by the high voltages. As a result, high voltage devices have high threshold voltages and large device areas. The layout and the circuit architecture are therefore optimized to minimize the required area. On the other hand, low voltage devices show improved analog characteristics, and due to thinner gate oxide better matching characteristics, which is important for building analog circuits, such as the sense amplifier. Therefore, the combination of high voltage and low voltage devices is essential for the combination of protection and accurate read operation. Because of the poor properties of p-channel devices, n-channel devices are predominantly used.

During a read operation, a memory cell is selected by means of a first access line, for example a bit line, and a second access line, for example a word line. First access lines of memory cells that are not used for selecting and accessing the memory cell are usually kept at a defined bias, for example, by being connected to a defined potential, such as the ground potential. As a result, the read operation of the selected memory cell will not be disturbed by capacitive coupling with adjacent first access lines. Usually, n-channel devices are used for biasing the adjacent first access lines.

Because the devices in the multiplexer circuit and the discharge devices have the same polarity, an additional bus with an inverted signal has to be routed. The bus needs to be designed for high-voltages because the bit line is biased to voltages larger than the break down voltage of the low voltage devices during write or erase operations. However, a high-voltage design requires a high voltage level shifter for the control of the gates which requires area and consumes dynamic power during operation provided by the charge pumps. Typically, charge pumps draw a large current on the supply line VDD. The use of p-channel devices for biasing is possible, however, a negative overdrive is required or the first access lines that are not used for selecting the memory cell are only weakly biased. This situation arises especially in scaled technology nodes where the supply voltage VDD is in the range of the threshold voltage of the high voltage devices.

SUMMARY

A circuit arrangement is provided, having a plurality of electronic components; a plurality of first access lines and second access lines, wherein each electronic component is coupled with at least one first access line and at least one second access line; an access controller configured to control an access to at least one electronic component of the plurality of electronic components via the at least one first access line and the at least one second access line; a bias circuit configured to provide a defined potential to at least one of the first access lines, wherein the bias circuit is configured, during an access to an electronic component via one selected first access line of the plurality of first access lines, to provide the defined potential to at least one access line of the plurality of first access lines, wherein the at least one first access lines is arranged adjacent or next to the selected first access line.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows details of an embodiment of a circuit arrangement; and

FIG. 3 shows an embodiment for operating a circuit arrangement.

DESCRIPTION

Figure 1:
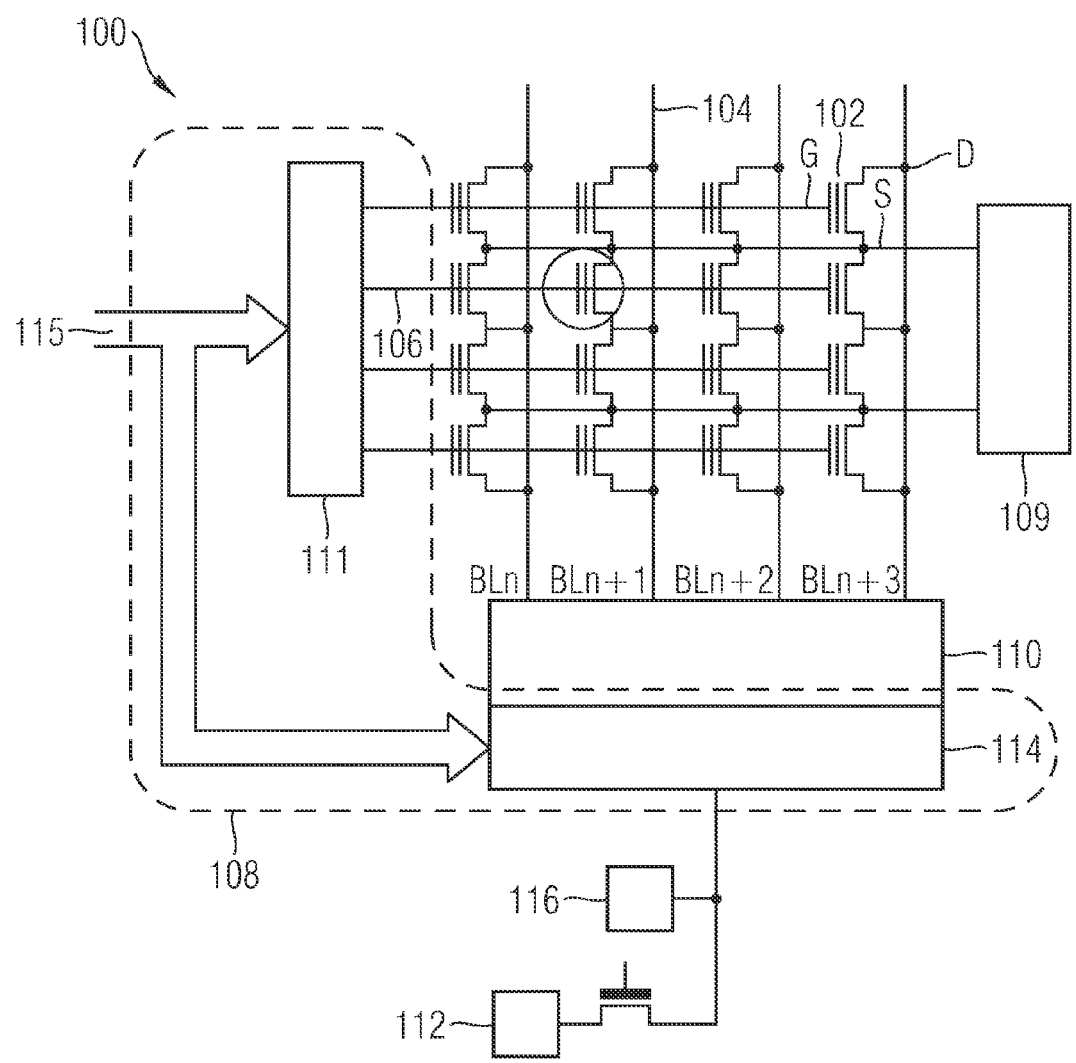
FIG. 1 shows an embodiment of a circuit arrangement.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The words "adjacent" and "next" are not limited to horizontal arrangements or vertical arrangements only, but also include combinations in one or both directions. The words "adjacent" and "next" include electric coupling in all directions. In other words, the electric coupling can occur in three dimensions.

A circuit arrangement, comprising: a plurality of electronic components; a plurality of first access lines and second access lines, wherein each electronic component is coupled with at least one first access line and at least one second access line; an access controller configured to control an access to at least one electronic component of the plurality of electronic components via the at least one first access line and the at least one second access line; a bias circuit configured to provide a defined potential to at least one of the first access lines, wherein the bias circuit is configured to, during an access to an electronic component via one selected first access line of the plurality of first access lines, provide the defined potential to the at least one first access line, wherein the at least one first access line is arranged next to the selected first access line.

In an embodiment, the bias circuit is further configured to, during the access to the electronic component, let the potentials of the first access lines of the plurality of first access lines other than the selected first access line and the at least one first access line arranged next to the selected first access line float.

In an embodiment, the first access lines other than the selected first access line and the at least one first access line arranged next to the selected first access line are disconnected from the defined potential.

In an embodiment, the at least one first access line arranged next to the selected first access line is associated with an electronic component other than the accessed electronic component.

In an embodiment, the plurality of electronic components comprises a plurality of memory cells.

In an embodiment, the plurality of memory cells comprises a plurality of volatile memory cells.

In an embodiment, the plurality of volatile memory cells comprises a plurality of volatile memory cells selected from a group consisting of dynamic random access memory cells and static random access memory cells.

In an embodiment, the plurality of memory cells comprises a plurality of non-volatile memory cells.

In an embodiment, the plurality of non-volatile memory cells comprises a plurality of non-volatile memory cells selected from a group consisting of flash memory cells and resistive memory cells.

In an embodiment, the plurality of electronic components comprises a plurality of sensor elements.

In an embodiment, the plurality of sensor elements comprises a plurality of biosensor elements.

In an embodiment, the plurality of first access lines comprises a plurality of bit lines; and the plurality of second access lines comprises a plurality of word lines.

In an embodiment, the access controller is configured to provide at least one of a read access and a write access to the at least one electronic component of the plurality of electronic components via the at least one first access line and the at least one second access line.

An embodiment further comprises at least one sense amplifier coupled to the plurality of first access lines.

In an embodiment, at least one multiplexer circuit is connected between the plurality of first access lines and the at least one sense amplifier.

In an embodiment, at least one write buffer circuit coupled to the plurality of first access lines.

In an embodiment, the bias circuit comprises a plurality of switches, each switch being connected between a bias line coupled to the defined potential and a respective first access line.

In an embodiment, each switch comprises at least one control terminal and at least two controlled terminals, wherein the at least two controlled terminals are connected between the bias line coupled to the defined potential and a respective first access line, and wherein the at least one control terminal is coupled to the access controller.

In an embodiment, at least one first access line has associated at least two switches; wherein the control terminal of at least one first switch of the associated at least two switches is connected to the access controller controlling the selection of at least one first adjacent first access line of the respective at least one first access line; and wherein the control terminal of at least one second switch of the associated at least two switches is connected to the access controller controlling the selection of at least one second adjacent first access line of the respective at least one first access line.

In an embodiment, the access controller comprises at least one multiplexer circuit connected between the plurality of at least one first access lines and at least one of at least one sense amplifier and at least one write buffer circuit; and wherein the control terminal is coupled to the at least one multiplexer circuit to control the switches dependent on the control of the multiplexer circuit.

In an embodiment, the multiplexer circuit comprises a plurality of switches, each switch being associated with a respective at least one first access line and comprising a control terminal and at least two controlled terminals, the at least one control terminal is coupled to at least one of the control terminal of a switch connected between the bias line coupled to the defined potential and at least one first adjacent first access line of the respective at least one first access line and the control terminal of a switch connected between the bias line coupled to the defined potential and at least one first adjacent first access line of the respective first access line; and wherein one of the two controlled terminals is coupled to the respective at least one first access lines and the other of the at least two controlled terminals is coupled to at least one of the at least one sense amplifier and the at least one write buffer circuit.

In an embodiment, the access controller comprises a plurality of access field effect transistors; wherein the bias circuit comprises a plurality of bias field effect transistors; wherein the access field effect transistors and the bias field effect transistors are of the same conductivity type.

In an embodiment, the access field effect transistors and the bias field effect transistors are arranged in the same well.

In an embodiment, the access field effect transistors and the bias field effect transistors share a common active area.

A circuit arrangement comprising a plurality of electronic components being arranged in a matrix, the matrix comprising a plurality of bit lines and a plurality of word lines, wherein each electronic component is coupled with at least one bit line and at least one word line; an access controller configured to control an access to at least one electronic component of the matrix via the at least one bit line and the at least one word line; a bias circuit configured to provide a defined potential selectively to each of the bit lines and configured to provide the defined potential to only one or two bit lines during an access to an electronic component, wherein the one or two bit lines are arranged next to the bit line via which the electronic component is accessed.

In an embodiment, the at least one or two bit lines arranged next to the bit line via which the electronic component is accessed are each associated with an electronic component other than the electronic component accessed.

In an embodiment, the plurality of electronic components comprises a plurality of volatile memory cells selected from a group consisting of dynamic random access memory cells and static random access memory cells.

In an embodiment, the plurality of memory cells comprises a plurality of non-volatile memory cells selected from a group consisting of floating gate memory cells, charge trapping memory cells, magnetoresistive memory cells, phase change memory cells, conductive bridging memory cells and ferroelectric memory cells.

In an embodiment, the plurality of electronic components comprises a plurality of sensor elements.

In an embodiment, the access controller is configured to provide to the at least one electronic component at least one of a read access via at least one sense amplifier coupled to the plurality of bit lines; and a write access via at least one write buffer circuit coupled to the plurality of bit lines.

In an embodiment, the bias circuit comprises a plurality of switches, each switch comprising a control terminal and two controlled terminals, wherein the two controlled terminals are connected between a bias line coupled to the defined potential and a respective bit line, and wherein the control terminal is coupled to the access controller.

In an embodiment, the access controller further comprises at least a first multiplexer circuit, wherein the first multiplexer circuit comprises a plurality of switches each comprising at least one first control terminal and at least two controlled terminals, wherein a first of the at least two controlled terminals is coupled to a respective bit line and the other of the at least two controlled terminals is coupled to at least one of the at least one sense amplifier and the at least one write buffer circuit; wherein the control terminal is coupled to at least one of a control terminal of a switch associated with a first adjacent bit line of the respective bit line and at least one first control terminal of a switch associated with a second adjacent bit line of the respective bit line.

In an embodiment, the plurality of switches of the access controller and the plurality of switches of the bias circuit are field effect transistors of the same conductivity type.

In an embodiment, the field effect transistors are arranged in the same well.

In an embodiment, the field effect transistors share a common active area.

A method for operating a circuit arrangement, comprising: selecting at least one of a plurality of electronic components of the circuit arrangement for access by means of at least one of a plurality of first access lines and at least one of a plurality of second access lines; and applying a defined potential to only at least one of first access lines, wherein the at least one first access line is arranged next to the at least one of a plurality of first access lines used for selecting the at least one of a plurality of electronic components.

In an embodiment, selecting the at least one of a plurality of electronic components of the circuit arrangement for access and applying a defined potential to only the at least one first access line which is arranged next to the at least one of a plurality of first access lines used for selecting the at least of a plurality of electronic components are performed simultaneously.

In an embodiment, selecting the at least one of a plurality of electronic components for access comprises applying at least one control signal to at least one switch, wherein the at least one switch is coupled to the at least one of the plurality of first access lines.

In an embodiment, applying the defined potential comprises applying a control signal to at least one or two switches, wherein the at least one or two switches are coupled to the at least at least one first access lines arranged next to the at least one first access lines used for selecting the at least one of a plurality of electronic components.

In an embodiment, applying the defined potential comprises applying a control signal to a switch, wherein the switch is coupled to a first access line arranged adjacent on a side of the at least one first access line used for selecting the at least one of a plurality of electronic components.

In an embodiment, applying the defined potential comprises applying at least one first control signal to another switch, wherein the other switch is coupled to another of the at least one first access line arranged adjacent on another side of the at least one first access line used for selecting the at least one of a plurality of electronic components.

In an embodiment, the control signal to the switch for selecting the at least one of a plurality of electronic components for access and the control signal to at least one of the switch and the other switch for applying a defined potential are applied simultaneously.

In an embodiment, the electronic component that is selected for access via a sense amplifier coupled to the plurality of first access lines is read.

In an embodiment, the electronic component that is selected for access via a write buffer circuit coupled to the plurality of first access lines is written.

In an embodiment, the plurality of electronic components is erased by applying a second defined potential as control signals to the switches coupled to the first access lines used for selecting the at least one of a plurality of electronic components; by applying the second defined potential to a line configured to provide a defined potential to at least one of the plurality of first access lines; by applying the second defined potential to at least one of a sense amplifier and a write buffer circuit; and by applying the second defined potential to the plurality of first access lines.

In an embodiment, the second defined potential is a well potential.

FIG. 1 shows a circuit arrangement 100 with a plurality of electronic components 102 in accordance with various embodiments. For the sake of clarity, not all electronic components 102 have been labeled by a reference sign 102. However, all elements presented with the same symbol as the electronic component referenced by reference sign 102 are also to be considered as electronic components 102. The electronic components 102 may be arranged in the form of a matrix. They may be arranged in columns in a first direction and in rows in a second direction. However, in various embodiments, the electronic components 102 may be arranged in any other appropriate arrangement, for example in a zig-zag arrangement. The electronic components 102 may be memory cells, for example volatile memory cells or non-volatile memory cells. The volatile memory cells may be dynamic random access memory (DRAM) cells or static random access memory (SRAM) cells. The non-volatile memory cells may be flash memory cells, for example floating gate memory cells or charge trapping memory cells, or may be resistive memory cells, for example magnetoresistive memory cells, phase change memory cells, conductive bridging memory cells or ferroelectric memory cells. Moreover, the electronic components 102 may be sensor elements, for example biosensor elements. The biosensor elements may use antibodies as recognition elements to detect targets. Fluorescent antibodies may bind to the target and can be detected using a charge coupled device (CCD) camera. Each electronic component 102 may include one or more transistors, such as e.g. one or more field effect transistors (FETs), e.g. one or more metal oxide semiconductor field effect transistors (MOSFETs) or one or more metal insulator semiconductor field effect transistors (MISFETs), e.g. one or more complementary metal oxide semiconductor field effect transistors (CMOSFETs). Each electronic component 102 may include at least a first control terminal (e.g. a gate terminal (G)) and at least two controlled terminals (e.g. a first controlled terminal (e.g. a drain terminal (D)) and a second controlled terminal (e.g. a source terminal (S)). Thus, in various embodiments, the control terminal G may be a gate terminal and one of the controlled terminals D may be a drain terminal and the other of the controlled terminals S may be a source terminal. For the sake of clarity, the control terminals G and the controlled terminals D and S of the other electronic components 102 are not labeled. However, the other electronic components 102 may also have respective control terminals G and respective controlled terminals D and S.

The embodiment of the circuit arrangement 100 may have a plurality of first access lines 104 and may have a plurality of second access lines 106. For the sake of clarity, not all first access lines and not all second access lines have been referenced by corresponding reference signs 104 and 106. However, all first access lines presented with the same structure as the first access line referenced by reference sign 104 are also to be considered as first access lines 104 and all second access lines presented with the same structure as the second access line referenced by reference sign 106 are also to be considered as second access lines 106. The first access lines 104 may be bit lines and the second access lines 106 may be word lines.

The first access lines 104 may be arranged along the first direction and the second access lines 106 may be arranged along the second direction, wherein the first direction forms a non-zero angle (in general an arbitrary angle, e.g. an angle of 90°) with the second direction. Thus, in various embodiments, the first access lines 104 may run perpendicular to the second access lines 106.

Each electronic component 102 may be coupled with at least one first access line 104 and at least one second access line 106. The at least one first access line 104 may be coupled to one of the two controlled terminals D and S and the at least one second access line 106 may be coupled to the control terminal G. Each electronic component 102 may be selected for access by a respective first access line 104 and a respective second access line 106 coupled to the electronic component 102.

While only sixteen electronic components 102 and four first access lines 104 and four second access lines 106 are shown, the circuit arrangement 100 may have a larger or smaller number of electronic components 102 with a corresponding larger or smaller number of first access lines 104 and a corresponding larger or smaller number of second access lines 106, e.g. hundreds or thousands or millions of electronic components 102 and first and second access lines 104, 106.

The circuit arrangement 100 may have an access controller 108. The access controller 108 may have a word line decoder 111 or row decoder 111 and may have at least one first multiplexer circuit 114 or column decoder 114. The access controller 108 may be configured to control an access to at least one electronic component 102 by selecting the electronic component 102 via the first access line 104 and the second access line 106 that are coupled to the electronic component 102.

The word line decoder 111 may be physically located on one side of the matrix of electronic components 102 or may be distributed to at least two sides of the matrix of electronic components 102.

The column decoder 111 may be physically located on one side of the matrix of electronic components 102 or may be distributed to at least two sides of the matrix of electronic components 102.

The multiplexer circuit 114 may be connected to the plurality of first access lines 104 and may select one of the first access lines 104. The multiplexer circuit 114 may couple the selected first access line 104 to a sense amplifier 116 or to a write buffer circuit 116, or to both. The word line decoder 111 may be connected to the plurality of second access lines 106 and may select one of the second access lines 106. It may select the second access line 106 by applying a voltage to it. The voltage may be a voltage that allows a conduction of electric current between the controlled terminals D and S of the electronic component 102. The word line decoder 111 may apply another voltage to the second access line 106 that are not selected. The other voltage may be a voltage that does not allow a conduction of electric current between the controlled terminals D and S of the electronic component 102.

The multiplexer circuit 114 may be connected to the plurality of first access lines 104 and may select one of the first access lines 104. The multiplexer circuit 114 may couple the selected first access line 104 to a sense amplifier 116 or to a write buffer circuit 116, or to both. The word line decoder 111 may be connected to the plurality of second access lines 106 and may select one of the second access lines 106. It may select the second access line 106 by applying a voltage to it. The voltage may be a voltage that allows a conduction of an at least first electric current between the controlled terminals D and S of the electronic component 102. The word line decoder 111 may apply another voltage to the second access line 106 that are not selected. The other voltage may be a voltage that allows a conduction of an at least second electric current between the controlled terminals D and S of the electronic component 102.

The access controller 108 may have an input of an address 115. The address 115 may determine which of the first access lines 104 is selected by the multiplexer circuit 114 and which of the second access lines 106 is selected by the word line decoder 111. The access controller 108 may select one of the electronic components 102 for a read access or for a write access.

The row decoder 111 selects at least two rows to one sensing circuit for simultaneous read operation.

The row decoder 111 selects at least two rows to one write buffer for simultaneous write operation.

The circuit arrangement 100 may have a bias circuit 110. The bias circuit 110 may be configured to provide a defined potential to one or more of the first access lines 104. The first access line 104 which is selected to access an electronic component 102 does not need to be provided with a defined potential by the bias circuit 110 during the access. Instead, the potential on the first access line 104 which is selected to access an electronic component 102 may be used for reading or writing information to and from the electronic component 102. The potential may depend on the state of or the information stored in the electronic component 102.

The first access line 104 which is arranged adjacent to a first side of the first access line 104 that is selected to access an electronic component 102 may be provided with a defined potential by the bias circuit 110 during the access to the electronic component 102. Another first access line 104 which is arranged to a second side of the first access line 104 that is selected to access an electronic component 102 may be provided with a defined potential by the bias circuit 110 during the access to the electronic component 102. The phrase "adjacent" is used in the specification to mean e.g. "next to in location" or "neighboring". The first side may be a left side with respect to the selected first access line 104. The second side may be a right side with respect to the selected first access line 104. The first side and the second side may lie on opposing sides of the first access line 104 selected to access an electronic component 102.

As an example, the bit line 104 that is labeled BLn is adjacent to the bit line 104 labeled BLn+1 (n being an integer number greater than zero). It is arranged on a first side, here on the left side, with respect to the bit line 104 labeled BLn+1. The bit line 104 labeled BLn+2 is also adjacent to the bit line labeled BLn+1. It is arranged on a second side, here on the right side, with respect to the bit line 104 labeled BLn+1. The defined potential maybe a ground potential.

The bias circuit 110 may be configured to not provide the defined potential to first access lines 104 which are not used to access an electronic component 102 and which are not arranged adjacent on the first side or adjacent on the second side of the first access line 104 that is selected to access an electronic component 102. The electric potentials of these first access lines 104 to which no defined electric potential is provided by the bias circuit 110 during access may be floating, that is, no fixed electric voltage is imposed on them. In other words, during an access to an electronic component 102, the bias circuit 110 may provide the defined potential only to the first access lines 104 which are arranged adjacent on the first side or adjacent on the second side of the first access line 104 that is selected to access the electronic component 102.

As an example, in FIG. 1, if the bit line 104 which is labeled BLn+1 is selected to access an electronic component 102, only the adjacent bit lines 104 labeled BLn and BLn+2 are coupled to the defined potential by the bias circuit 110. The bit line 104 labeled BLn+3 is not adjacent the bit line 104 labeled BLn+1. Its potential is left floating. The potential of the bit line 104 labeled BLn+1 may depend on the state of or on the information stored in the electronic component accessed by the bit line 104 labeled BLn+1.

The circuit arrangement 100 may have a source switch 109. The source switch 109 may be configured to provide one or more bias potentials to the other controlled terminals S of the plurality of electronic components 102. The bias potential may depend on the operation performed on the selected electronic component 102. The bias potential may be the same, such as for example, a ground potential, for reading and writing the selected electronic component 102. The bias potential may be a high-voltage for erasing the selected electronic component 102.

FIG. 2 shows a bias circuit 110 and of a multiplexer circuit 114 of an embodiment of a circuit arrangement 100. The bias circuit 110 and the multiplexer circuit 114 may correspond to the bias circuit 110 and the multiplexer circuit 114 of the circuit arrangement 100 shown in FIG. 1. The description of the bias circuit 110 and of the multiplexer circuit 114 given in conjunction with FIG. 1 may apply to FIG. 2, and vice versa.

The bias circuit 110 may have a bias line 204 and a plurality of switches 202. For the sake of clarity, not all switches 202 of the bias circuit 110 have been labeled by a reference sign 202. However, all elements in the bias circuit 110 presented with the same symbol as the switch referenced by reference sign 202 are also to be considered as switches 202. For further differentiation among the switches 202, they may be labeled 210 and 214. A defined potential, for example a ground potential, may be coupled to the bias line 204.

Each switch 202 may connect the bias line 204 to a respective first access line 104. For the sake of clarity, not all first access lines 104 of the bias circuit 110 have been labeled by a reference sign 104. However, all elements in the bias circuit 110 presented with the same symbol as the first access line referenced by reference sign 104 are also to be considered as first access lines 104. For further differentiation among the first access lines 104, they may be labeled 212, 216, BLn, BLn+1, BLn+2 and BLn+3.

Each switch 202 may have a first control terminal 206 and at least two controlled terminals 208. For the sake of clarity, not all control terminals 206 of the switches 202 have been labeled by a reference sign 206 and not all controlled terminals 208 of the switches 202 have been labeled by a reference sign 208. However, all elements in the bias circuit 110 corresponding to the control terminals referenced by reference signs 206 are also to be considered as control terminals 206 and all elements in the bias circuit 110 corresponding to the controlled terminals 208 referenced by reference signs 208 are also to be considered as controlled terminals 208.

One of the two controlled terminals 208 of each switch 202 of the bias circuit 110 may be connected to the bias line 204. The other of the two controlled terminals 208 of each switch 202 may be connected to a respective first access line 104. The respective first access line 104 may be biased to the defined potential of the bias line 204 by closing the switch 202 under the influence of a signal applied to the control terminal 206 of the switch 202. The respective first access lines 104 may be biased to reduce read disturb. The control terminal 206 of each switch 202 may be coupled to the access controller 108. It may be coupled to the multiplexer circuit 114 of the access controller 108.

Each first access line 104 may have associated at least two switches 202 of the bias circuit 110. The control terminal 206 of a first switch 210 of the associated at least two switches 202 may be connected to the access controller 108 controlling the selection of a first adjacent first access line 212. The first adjacent first access line 212 is adjacent to the first access line 104 with the associated two switches 202. The control terminal 206 of a second switch 214 of the associated two switches 202 may be connected to the access controller 108 controlling the selection of an at least second adjacent first access line 216. The second adjacent first access line 212 is adjacent to the first access line 104 with the associated two switches 202. The first access line 104 with the associated two switches 202 may be connected to the bias line 204 when either one or both of the first adjacent first access line 212 and second adjacent first access line 216 is selected by the access controller 108. The first access line 104 may then be at the defined potential to which the bias line 204 is coupled and will not interfere by capacitive coupling with a read process when one of the first adjacent first access line 212 and second adjacent first access line 216 is selected for accessing an electronic component 102.

While only four first access lines 104 with eight associated switches 202 are shown, the bias circuit 110 may have a larger or smaller number of first access lines 104 with a corresponding larger or smaller number of associated switches 202.

The multiplexer circuit 114 may be connected between the plurality of first access lines 104 and at least one of at least one sense amplifier 112 and at least one write buffer circuit 116. The multiplexer circuit 114 may have a plurality of switches 218. Each switch 218 may have a control terminal 220 and two controlled terminals 222. For the sake of clarity, not all switches 218, control terminals 220 and controlled terminals 208 have been labeled by reference signs. However, all elements in the multiplexer circuit 114 that correspond to the switch, the control terminal and the controlled terminals referenced, respectively, by the reference signs 218, 220 and 208 are to be considered as switches 218, control terminals 220 and controlled terminals 222, respectively.

One of the controlled terminals 222 of a switch 218 may be coupled to a respective first access line 104 and the other of the two controlled terminals 222 of the switch 218 may be coupled to at least one of at least one sense amplifier 102 and at least one write buffer circuit 116. If the switch 218 is closed, for example under the influence of a signal applied to the control terminal 220, the electrical terminals 222 may be electrically connected to each other. The respective first access line 104 may be coupled to the sense amplifier 122 or the write buffer circuit 116. An electronic component 102 that is coupled to the respective first access line 104 may be read by means of the sense amplifier 102 or may be written by means of the write buffer circuit 116.

The multiplexer circuit 114 may have select lines 224, which may carry signals for the control terminals 220 of the switches 222 for the selection of a first access line 104. The signals may be derived from an address 115, as shown in and described in conjunction with FIG. 1.

The control terminal 220 of a switch 218 in the multiplexer circuit 114 may be coupled to a control terminal 206 of a switch 202 of the bias circuit 110 and may be coupled to a control terminal 206 of another switch 202 of the bias circuit 110. When a first access line 104 is selected, for example by applying a signal to the control terminal 220 of a corresponding switch 218, a signal, which may be the same signal, may be applied to the control terminal 206 of the switch 202 and to the control terminal 206 of the other switch 202 of the bias circuit 110. The switch 202 may connect at least one first adjacent first access line 212 to the bias line 204. The at least one first adjacent first access line 212 may be biased to the defined potential which may be coupled to the bias line 204 and which may be a ground potential. The other switch 202 may connect a second adjacent first access line 216 to the bias line 204. The second adjacent first access line 216 may be biased to the defined potential which may be coupled to the bias line 204 and which may be a ground potential. The signal applied to the control terminal 220 of a switch 218 for selecting a first access line 104 is also applied to the control terminal 206 of the switch 202 of the bias circuit 110 and is also applied to a control terminal 206 of the other switch 202 of the bias circuit 110, so that selecting a first access line 104 and biasing a first adjacent first access line 212 and a second adjacent first access lines 216 may be simultaneous.

For example, a first access line 104, for example the first access line 104 labeled BLn+1, may be selected by a signal on the select lines 224. The signal on the select lines 224 is applied to the control terminal 220 of the switch 218 which has one of its controlled terminals 222 connected to the first access line 104 labeled BLn+1 and which has the other one of its controlled terminals 222 connected to the write buffer circuit 116 or the sense amplifier circuit 112 or to both. If the signal applied to the control terminal 220 causes the switch 218 to close, or in other words to conduct, the two controlled terminals 222 of the switch 218 will be shorted to each other and the first access line 104 labeled BLn+1 will be coupled to the write buffer circuit 116 or the sense amplifier circuit 112 or to both. Since the first access line 104 labeled BLn+1 is coupled to an electronic component 102, as is shown in FIG. 1, the electronic component 102 can be read or written to by means of the write buffer circuit 116 and/or sense amplifier circuit 112. The first access line 104 labeled BLn+1 may have next to it adjacent first access lines 212 and 216, respectively labeled BLn and BLn+2 (n being an integer number greater than zero). The adjacent first access lines 212 and 216 labeled BLn and BLn+2, respectively, are biased to the defined potential of the bias line 204, since the signal applied to the control terminal 220 of the switch 218 for selecting the first access line 104 labeled BLn+1 is also applied to the control terminals 206 of the switches 202. The signal causes the switches 202 to conduct so that the adjacent first access lines 212 and 216 labeled BLn and BLn+2, respectively, are connected to the defined potential of the bias line 204. Reading the electronic component 102 selected for access will not suffer from read disturb, since the potentials of the adjacent first access lines 212 and 216 labeled BLn and BLn+2, respectively, are well defined.

While only four first access lines 104 with four switches 218 are shown, the multiplexer 114 may have a larger or smaller number of first access lines 104 with a corresponding larger or smaller number of switches 218. While the multiplexer circuit 114 is shown with a separate switch 218 for each first access line 104, multiplexer circuits 114 with a hierarchical structure can also be used.

While each first access line 104 is shown with two associated switches 202, the bias circuit 110 may also be configured with only one switch 202 for each first access line 104. In this case, one of the first access lines 104 which is selected to access an electronic component 102 will only have one adjacent first access line 212 or 216 which is coupled to the defined potential. The potential of the other adjacent first access line will be left floating.

The multiplexer circuit 114 of the access controller 108 may have a plurality of access field effect transistors (FET) 218. The access FETs 218 may be used as switches 218 for connecting first access lines or bit lines 104 to the write buffer circuit 116 or the sense amplifier 112. The bias circuit 110 may have a plurality of bias field effect transistors (FET) 202. The bias FETs 202 may be used as switches 202 for connecting first access lines or bit lines 104 to the bias line 204. The access FETs 218 and the bias FETs 202 may be of the same conductivity type. They may both be n-type FETs or both be p-type FETs. The access FETs 218 and the bias FETs 202 may be arranged in the same well. The well may be arranged in a substrate of the circuit arrangement 100. The access FETs 218 and the bias FETs 202 may share a common active area, that is, they may share the physical part of the circuit arrangement 100 in which the active elements are arranged. As a result, the layout for the bias circuit 110 and the multiplexer circuit 114 can be greatly reduced.

As the switches 218 of the multiplexer circuit 114 and the switches 202 of the bias circuit 110 share the same signal at their control terminals 220 and 206, respectively, only one polarity of the signal may be required. There may be no need for an additional high-voltage bus. No inverted signal may need to be routed so that the device area and the dynamic power consumption of the circuit arrangement 100 can be reduced.

FIG. 3 shows an embodiment for operating a circuit arrangement, for example the embodiment of the circuit arrangement 100 as is shown in FIG. 1 and FIG. 2. The corresponding description in conjunction with FIG. 1 and FIG. 2 may also apply to FIG. 3, and vice versa.

During an erase operation, such as a page erase operation or a sector erase operation, all the first access lines 104, for the example bit lines, may be coupled to a well bias $V_{well}$. The well bias $V_{well}$ may be a second defined potential. In a first embodiment, the well bias is in the range of 4 to 10V. In a second embodiment, the well bias is in the range of 10 to 20V. The well may be the well in which the switches 218 of the multiplexer circuit 114, for example the access FETs and the switches 202 of the bias circuit 110, for example the bias FETs, may be arranged in. A large voltage drop may occur across the switches 218 of the multiplexer circuit 114 and the switches 202 of the bias circuit 110. The large voltage drop can lead to leakage currents through each of the switches 202 and 218.

All the terminals, that is the control terminal 206 and the controlled terminals 208 of all the switches or bias devices 202 may be coupled a well potential $V_{well}$. Similarly, all the terminals, that is the control terminal 220 and the controlled terminals 222 of all the switches or access devices 218 may be coupled the well potential $V_{well}$. The control terminals 220 of the switches 218 of the multiplexer circuit 114 and the control terminals 206 of the switches 202 of the bias circuit 110 may be coupled to the well potential $V_{well}$ by coupling the well potential $V_{well}$ to all of the select lines 224 since all the control terminals 206 and 220 may be coupled to one of the select lines 224.

One of the controlled terminals 208 of the switches 202 of the bias circuit 110 may be coupled to the well potential $V_{well}$ by coupling the well potential $V_{well}$ to the respective first access line 104 to which the switch 202 is coupled with one of its controlled terminals 208. Since one of the controlled terminals 222 of the switches 218 of the multiplexer circuit 114 is coupled to a respective first access line 104, it will also be at the well potential $V_{well}$. The other of the controlled terminals 208 of the switches 202 of the bias circuit 110 may be coupled to the well potential $V_{well}$ by coupling the well potential $V_{well}$ to the bias line 204 to which the switch 202 is coupled with the other of its controlled terminal 208. The other of the controlled terminals 222 of the switches 218 of the multiplexer circuit 218 are joined together and coupled to the write buffer circuit 116 and the sense amplifier circuit 112. Depending on the mode of operation, the node 222 may be biased either to an auxiliary bias during erase operation or the write bias, e.g. a bias range between 0 to 4V in a first embodiment or 4V to 10V in a second embodiment. During read operation, node 222 is connected to the sense amplifier with a bias depending on the contents of the connect memory cell or sensor element.

Since all the terminals 206 and 208 of all the switches 202 of the bias circuit 110 and all the terminals 220 and 222 of all the switches 218 of the multiplexer circuit 114 are biased to the well potential $V_{well}$, no leakage current is drawn from the charge pump that is used to provide a high-voltage by the multiplexer circuit 114. The only path for the leakage current is through a protection device, which may be coupled between the multiplexer circuit 114 and the sense amplifier 112 or the write buffer 116. The leakage current may therefore be reduced by a factor corresponding to the size of the multiplexer circuit 114. For example, if the multiplexer circuit 114 multiplexes thirty-two first access lines 104 it has a size of thirty-two and the leakage current may be reduced by a factor of thirty-two. The largest voltages are present during an erase operation, where the voltage drop is divided into a first voltage drop along devices 218 and a second voltage drop along the protection device.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
    a plurality of electronic components;
    a plurality of first access lines and second access lines, wherein each electronic component is coupled with at least one first access line and at least one second access line;
    an access controller configured to control an access to at least one electronic component of the plurality of electronic components via the at least one first access line and the at least one second access line;
    a bias circuit configured to provide a defined potential to at least one of the first access lines, wherein the bias circuit is configured to, during an access to an electronic component via one selected first access line of the plurality of first access lines during which a potential of the first access line depends on the state of or the information stored in said electronic component, provide the defined potential to the at least one first access line, wherein the at least one first access line is arranged next to the selected first access line.

2. The circuit arrangement of claim 1,
    wherein the bias circuit is further configured to, during the access to the electronic component, let the potentials of the first access lines of the plurality of first access lines other than the selected first access line and the at least one first access line arranged next to the selected first access line float.

3. The circuit arrangement of claim 1,
    wherein the first access lines other than the selected first access line and the at least one first access line arranged next to the selected first access line are disconnected from the defined potential.

4. The circuit arrangement of claim 1,
    wherein the at least one first access line arranged next to the selected first access line is associated with an electronic component other than the accessed electronic component.

5. The circuit arrangement of claim 1,
    wherein the plurality of electronic components comprises one of:
    a plurality of volatile memory cells selected from a group consisting of dynamic random access memory cells and static random access memory cells;
    a plurality of non-volatile memory cells selected from a group consisting of flash memory cells and resistive memory cells; and
    a plurality of sensor elements.

6. The circuit arrangement of claim 1, further comprising:
    at least one sense amplifier coupled to the plurality of first access lines; and
    a multiplexer circuit connected between the plurality of first access lines and the at least one sense amplifier.

7. The circuit arrangement of claim 6, further comprising:
    at least one write buffer circuit coupled to the plurality of first access lines.

8. The circuit arrangement of claim 1,
    wherein the bias circuit comprises a plurality of switches, each switch being connected between a bias line coupled to the defined potential and a respective first access line;
    wherein each switch comprises at least one control terminal and at least two controlled terminals, wherein the at least two controlled terminals are connected between the bias line coupled to the defined potential and a respective first access line, and wherein the at least one control terminal is coupled to the access controller.

9. The circuit arrangement of claim 8,
    wherein each first access line has associated at least two switches;
    wherein the at least one control terminal of at least one first switch of the associated at least two switches is connected to the access controller controlling the selection of at least one first adjacent first access line of the respective first access line; and
    wherein the at least one control terminal of at least one second switch of the associated at least two switches is connected to the access controller controlling the selection of an at least one second adjacent first access line of the respective first access line.

10. The circuit arrangement of claim 8,
    wherein the access controller comprises at least one multiplexer circuit connected between the plurality of first access lines and at least one of at least one sense amplifier and at least one write buffer circuit; and
    wherein the at least one control terminal is coupled to the multiplexer circuit to control the switches dependent on the control of the multiplexer circuit.

11. The circuit arrangement of claim 10,
    wherein the multiplexer circuit comprises a plurality of switches, each switch being associated with a respective first access line and comprising at least one control terminal and at least two controlled terminals,
    wherein the at least one control terminal is coupled to at least one of
        the control terminal of a switch connected between the bias line coupled to the defined potential and a first adjacent first access line of the respective first access line and the control terminal of a switch connected between the bias line coupled to the defined potential and a first adjacent first access line of the respective first access line; and wherein one of the at least two controlled terminals is coupled to the respective first access lines and the other of the at least two controlled terminals is coupled to at least one of the at least one sense amplifier and the at least one write buffer circuit.

12. The circuit arrangement of claim 1,
wherein the access controller comprises a plurality of access field effect transistors;
wherein the bias circuit comprises a plurality of bias field effect transistors;
wherein the access field effect transistors and the bias field effect transistors are of the same conductivity type.

13. The circuit arrangement of claim 12,
wherein the access field effect transistors and the bias field effect transistors are arranged in the same well.

14. A method for operating a circuit arrangement, comprising:
selecting at least one of a plurality of electronic components of the circuit arrangement for access by means of at least one of a plurality of first access lines and at least one of a plurality of second access lines; and
applying a defined bias to only at least one of first access lines, wherein the at least one first access line is arranged next to the at least one of a plurality of first access lines used for selecting the at least one of a plurality of electronic components,
wherein a potential of the at least one of a plurality of first access lines used for selecting the at least one of a plurality of electronic components depends on the state of or the information stored in said electronic component.

15. The method of claim 14,
wherein selecting the at least one of a plurality of electronic components of the circuit arrangement for access and applying a defined bias to only the at least one first access line which is arranged next to the at least one of a plurality of first access lines used for selecting the at least one of a plurality of electronic components are performed simultaneously.

16. The method of claim 14,
wherein selecting the at least one of a plurality of electronic components for access comprises applying at least one control signal to at least one switch, wherein the at least one switch is coupled to the at least one of the plurality of first access lines.

17. The method of claim 14,
wherein applying the defined bias comprises applying a control signal to at least one or two switches, wherein the at least one or two switches are coupled to the at least one first access lines arranged next to the at least one first access lines used for selecting the at least one of a plurality of electronic components.

18. The method of claim 14,
wherein applying the defined bias comprises applying at least a first control signal to at least one first switch, wherein the first switch is coupled to a at least first access line arranged adjacent on a side of the at least one first access line used for selecting the at least one of a plurality of electronic components.

19. The method of claim 18,
wherein applying the defined bias comprises applying at least one first control signal to at least another switch, wherein the at least other switch is coupled to at least another first access line arranged adjacent on another side of the at least one first access line used for selecting the at least one of a plurality of electronic components.

20. The method of claim 19,
wherein the control signal to the switch for selecting the at least one of a plurality of electronic components for access and the control signal to at least one of the switch and the other switch for applying a defined bias are applied simultaneously.

21. The method of claim 19,
wherein the defined bias is a ground potential.

22. The method of claim 14, further comprising:
reading the electronic component that is selected for access via a sense amplifier coupled to the plurality of first access lines.

23. The method of claim 14, further comprising
writing the electronic component that is selected for access via a write buffer circuit coupled to the plurality of first access lines.

24. The method of claim 14, further comprising
erasing the plurality of electronic components
by applying at least one second defined bias as control signals to the switches coupled to the first access lines used for selecting the at least one of a plurality of electronic components;
by applying the at least second defined bias to a line configured to provide a defined bias to at least one of the plurality of first access lines;
by applying the at least second defined bias to at least one of a sense amplifier and a write buffer circuit; and
by applying the second defined bias to the plurality of first access lines.

25. The method of claim 24,
wherein the second defined bias is a well potential.

* * * * *